(12) United States Patent
Hamazawa

(10) Patent No.: US 11,114,572 B2
(45) Date of Patent: Sep. 7, 2021

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Yasushi Hamazawa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/905,612

(22) Filed: Jun. 18, 2020

(65) Prior Publication Data
US 2020/0403104 A1    Dec. 24, 2020

(30) Foreign Application Priority Data
Jun. 20, 2019  (JP) .............................. JP2019-114393

(51) Int. Cl.
| H01L 29/00 | (2006.01) |
| H01L 29/866 | (2006.01) |
| H01L 23/00 | (2006.01) |
| H01L 21/38 | (2006.01) |
| H01L 21/308 | (2006.01) |
| H01L 29/06 | (2006.01) |

(52) U.S. Cl.
CPC .......... *H01L 29/866* (2013.01); *H01L 21/308* (2013.01); *H01L 21/38* (2013.01); *H01L 24/45* (2013.01); *H01L 24/85* (2013.01); *H01L 29/0646* (2013.01); *H01L 29/0692* (2013.01)

(58) Field of Classification Search
None
See application file for complete search history.

(56) References Cited

U.S. PATENT DOCUMENTS

2003/0042538 A1*  3/2003  Kumar .............. H01L 29/66068
257/328

FOREIGN PATENT DOCUMENTS

JP      S59-117174 A     7/1984

* cited by examiner

*Primary Examiner* — Reema Patel
(74) *Attorney, Agent, or Firm* — Rabin & Berdo, P.C.

(57) ABSTRACT

A semiconductor device includes a semiconductor layer of a first conductivity type, a second semiconductor layer of a second conductivity type embedded in the semiconductor layer, a first trench and a second trench formed in the semiconductor layer such that the first trench and the second trench penetrate the second semiconductor layer, a first insulating film formed on at least a side surface of the first trench, a second insulating film formed on at least a side surface of the second trench, a first sinker layer of the second conductivity type formed in a first portion of the semiconductor layer, a second sinker layer of the second conductivity type formed in the first portion of the semiconductor layer, a diode impurity region of the first conductivity type which is formed on the first surface of the semiconductor layer and forms a Zener diode by pn junction between the first sinker layer and the diode impurity region, a first wiring electrically connected to the diode impurity region, and a second wiring electrically connected to the second sinker layer.

14 Claims, 13 Drawing Sheets

SEMICONDUCTOR DEVICE AND METHOD FOR MANUFACTURING SEMICONDUCTOR DEVICE

CROSS-REFERENCE TO RELATED APPLICATIONS

The present application corresponds to Japanese Patent Application No. 2019-114393 filed in the Japan Patent Office on Jun. 20, 2019 and the entire disclosure of the application is incorporated herein by reference.

TECHNICAL FIELD

The present invention relates to a semiconductor device and a method for manufacturing the semiconductor device.

BACKGROUND ART

In recent years, among Zener diodes integrated into LSIs, so-called bulk Zener diodes have become mainstream in order to suppress a change in breakdown voltage over time. In a bulk Zener diode, a breakdown phenomenon occurs inside the silicon instead of the silicon oxide film interface.

For example, Patent Document 1 (JP S59-117174A) discloses a constant voltage diode including a p type semiconductor substrate, an n type impurity region partitioned by an $n^+$ buried layer and a $p^+$ separated diffusion layer in a predetermined region in the p type semiconductor substrate, a p type anode diffusion layer formed in the n type impurity region to a predetermined diffusion depth, an n type cathode diffusion layer formed on the anode diffusion layer to a predetermined diffusion depth, and a $p^+$ type constant voltage determination diffusion layer formed to be connected to a portion directly under the cathode diffusion layer and penetrating the anode diffusion layer to a diffusion depth so as to reach the inside of the n type impurity region.

SUMMARY OF INVENTION

However, a manufacturing process for the constant voltage diode disclosed in Patent Document 1 requires a dedicated mask layer for forming a $p^+$ type constant voltage determination diffusion layer. This may lead to an increase in cost.

An object of the present invention is to provide a semiconductor device that makes possible low-cost production of a Zener diode and causes a breakdown phenomenon inside the semiconductor layer and a method for manufacturing the semiconductor device.

A semiconductor device according to one aspect of the present invention includes a semiconductor layer of a first conductivity type having a first surface and a second surface on an opposite side to the first surface, a second semiconductor layer of a second conductivity type embedded in the semiconductor layer, a first trench and a second trench formed in the semiconductor layer such that the first trench and the second trench extend from the first surface in a thickness direction of the semiconductor layer and penetrate the second semiconductor layer in a sectional view in a direction intersecting the first surface, a first insulating film formed on at least a side surface of the first trench, a second insulating film formed on at least a side surface of the second trench, a first sinker layer of the second conductivity type formed in a first portion of the semiconductor layer defined by the second semiconductor layer, the first trench and second trench such that the first sinker layer extends in a depth direction of the first trench and is in contact with the second semiconductor layer and the first insulating film, a second sinker layer of the second conductivity type formed in the first portion of the semiconductor layer such that the first sinker layer extends in a depth direction of the second trench and is in contact with the second semiconductor layer and the second insulating film, a diode impurity region of the first conductivity type which is formed on the first surface of the semiconductor layer and forms a Zener diode by a pn junction between the first sinker layer and the diode impurity region, a first wiring electrically connected to the diode impurity region, and a second wiring electrically connected to the second sinker layer.

A method for manufacturing a semiconductor device according to one aspect of the present invention includes a step of forming a first trench and a second trench by selectively removing, through a mask, a semiconductor layer of a first conductivity type which has a first surface and a second surface on an opposite side to the first surface and in which a second semiconductor layer of a second conductivity type is embedded, with the first trench and the second trench extending from the first surface in a thickness direction of the semiconductor layer and penetrating the second semiconductor layer in a sectional view in a direction intersecting the first surface, a step of implanting an impurity of the second conductivity type into side surfaces of the first trench and the second trench while the mask is left on the semiconductor layer, a step of forming a first insulating film on at least a side surface of the first trench, a step of forming a second insulating film on at least a side surface of the second trench, a step of forming a first sinker layer of the second conductivity type and a second sinker layer of the second conductivity type by heat diffusion of an impurity of the second conductivity type such that the first sinker layer extends in a depth direction of the first trench and is in contact with the second semiconductor layer and the first insulating film, and the second sinker layer extends in a depth direction of the second trench and is in contact with the second semiconductor layer and the second insulating film, a step of forming a diode impurity region of the first conductivity type on the first surface of the semiconductor layer so as to be in contact with the first sinker layer, a step of forming a first wiring so as to be electrically connected to the diode impurity region, and a step of forming a second wiring so as to be electrically connected to the second sinker layer.

Effects of Invention

According to the semiconductor device according to one aspect of the present invention, the structure of a Zener diode is formed by a pn junction between the diode impurity region and the first sinker layer formed inside the semiconductor layer. The Zener diode having such a structure has a breakdown voltage (Zener voltage) determined by the concentration relationship between the diode impurity region and the first sinker layer.

The operation of the Zener diode in which, for example, the diode impurity region is of a p type, and the first sinker layer, the second semiconductor layer (buried layer), and the second sinker layer are of an n type will be described. In this case, when a voltage is applied between the first wiring (anode) and the second wiring (cathode), with the first wiring being a low-potential side and the second wiring being a high-potential side, a reverse voltage is applied to the Zener diode. When this reverse voltage exceeds the breakdown voltage, a breakdown phenomenon occurs at the interface (inside the semiconductor layer) between the diode impurity region and the first sinker layer, and a current flows. Thereafter, the current flows from the second sinker layer to the first wiring (anode) through the second semiconductor layer and the first sinker layer. The occurrence of the breakdown phenomenon of the Zener diode inside the semiconductor layer in this manner can suppress a change in breakdown voltage over time.

The first sinker layer and the second sinker layer forming the Zener diode are formed by impurity implantation using a mask used at the time of forming the first trench and the second trench. Accordingly, there is no need to add a dedicated mask layer for forming the first sinker layer and the second sinker layer. This makes it possible to suppress an increase in cost.

A factor that determines the depth of the first sinker layer and the second sinker layer extending from the first surface of the semiconductor layer to the bottom portions of the first trench and the second trench is a second conductivity type impurity implantation range for the side surfaces of the first trench and the second trench. Accordingly, in order to bring the first sinker layer and the second sinker layer into contact with the second semiconductor layer, it is only required to extend the second conductivity type impurity implantation range to the bottom portions of the first trench and the second trench. This simplifies the process and makes it possible to suppress an increase in cost.

In contrast to this, in the manner of selectively implanting an impurity into a surface portion of the semiconductor layer and bringing the impurity into contact with the second semiconductor layer by heat diffusion, it is necessary to perform heat diffusion at high temperature for a long period of time. Accordingly, the heat treatment expands the second semiconductor layer. As a result, the first trench and the second trench need to be formed deeper. This may lead to an increase in cost.

DESCRIPTION OF EMBODIMENTS

Figure 1:
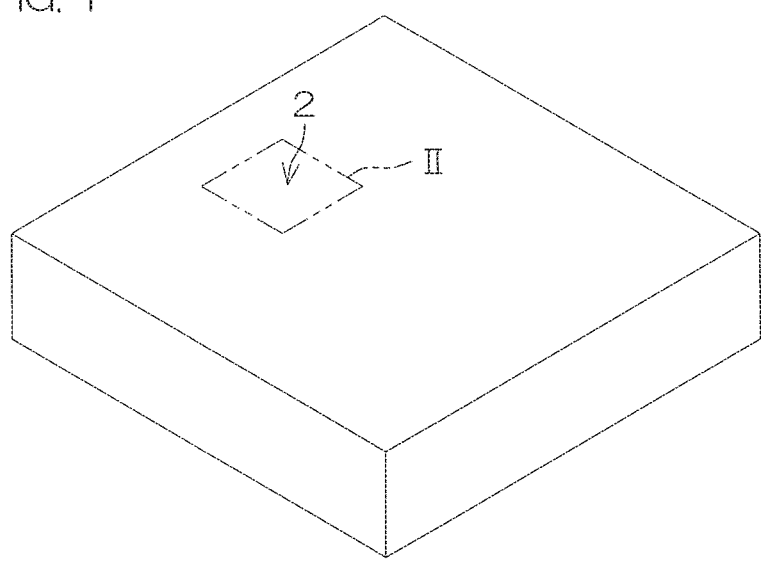
FIG. 1 is a schematic perspective view of a semiconductor device according to a preferred embodiment of the present invention.

First, preferred embodiments of the present invention will be listed and described.

A semiconductor device according to a preferred embodiment of the present invention includes a semiconductor layer of a first conductivity type having a first surface and a second surface on an opposite side to the first surface, a second semiconductor layer of a second conductivity type embedded in the semiconductor layer, a first trench and a second trench formed in the semiconductor layer such that the first trench and the second trench extend from the first surface in a thickness direction of the semiconductor layer and penetrate the second semiconductor layer in a sectional view in a direction intersecting the first surface, a first insulating film formed on at least a side surface of the first trench, a second insulating film formed on at least a side surface of the second trench, a first sinker layer of the second conductivity type formed in a first portion of the semiconductor layer defined by the second semiconductor layer, the first trench and second trench such that the first sinker layer extends in a depth direction of the first trench and is in contact with the second semiconductor layer and the first insulating film, a second sinker layer of the second conductivity type formed in the first portion of the semiconductor layer such that the second sinker layer extends in a depth direction of the second trench and is in contact with the second semiconductor layer and the second insulating film, a diode impurity region of the first conductivity type which is formed on the first surface of the semiconductor layer and forms a Zener diode by pn junction between the first sinker layer and the diode impurity region, a first wiring electrically connected to the diode impurity region, and a second wiring electrically connected to the second sinker layer.

In the semiconductor device according to a preferred embodiment of the present invention, the first sinker layer may be in contact with the first insulating film over the entire depth direction of the first trench.

In the semiconductor device according to a preferred embodiment of the present invention, the second sinker layer may be in contact with the second insulating film over the entire depth direction of the second trench.

In the semiconductor device according to a preferred embodiment of the present invention, the first sinker layer may have a thickness of 0.5 µm to 5 µm in a direction orthogonal to the depth direction of the first trench.

In the semiconductor device according to a preferred embodiment of the present invention, the second sinker layer may have a thickness of 0.5 µm to 5 µm in a direction orthogonal to the depth direction of the second trench.

In the semiconductor device according to a preferred embodiment of the present invention, the second semiconductor layer may have a thickness of 2 µm to 10 µm.

The semiconductor device according to a preferred embodiment of the present invention may further include a first impurity region of the first conductivity type formed on a bottom surface of the first trench and having a higher impurity concentration than the semiconductor layer and a first conductor that is embedded in the first trench through the first insulating film and is in contact with the first impurity region.

The semiconductor device according to a preferred embodiment of the present invention may further include a second impurity region of the first conductivity type formed on a bottom surface of the second trench and having a higher impurity concentration than the semiconductor layer and a second conductor that is embedded in the second trench through the second insulating film and is in contact with the second impurity region.

In the semiconductor device according to a preferred embodiment of the present invention, the first insulating film may be formed on a side surface and a bottom surface of the first trench, and the semiconductor device may include a first conductor embedded in the first trench through the first insulating film.

In the semiconductor device according to a preferred embodiment of the present invention, the second insulating film may be formed on a side surface and a bottom surface of the second trench, and the semiconductor device may include a second conductor embedded in the second trench through the second insulating film.

In the semiconductor device according to a preferred embodiment of the present invention, the second sinker layer may be formed in an annular shape surrounding the first sinker layer in a plan view in a direction along the first surface.

In the semiconductor device according to a preferred embodiment of the present invention, the first sinker layer and the second sinker layer may be formed in linear shapes parallel to each other in a plan view in a direction along the first surface.

A method for manufacturing a semiconductor device according to a preferred embodiment of the present invention includes a step of forming a first trench and a second trench by selectively removing, through a mask, a semiconductor layer of a first conductivity type which has a first surface and a second surface on an opposite side to the first surface and in which a second semiconductor layer of a second conductivity type is embedded, with the first trench and the second trench extending from the first surface in a thickness direction of the semiconductor layer and penetrating the second semiconductor layer in a sectional view in a direction intersecting the first surface, a step of implanting an impurity of the second conductivity type into side surfaces of the first trench and the second trench while the mask is left on the semiconductor layer, a step of forming a first insulating film on at least a side surface of the first trench, a step of forming a second insulating film on at least a side surface of the second trench, a step of forming a first sinker layer of the second conductivity type and a second sinker layer of the second conductivity type by heat diffusion of an impurity of the second conductivity type such that the first sinker layer extends in a depth direction of the first trench and is in contact with the second semiconductor layer and the first insulating film, and the second sinker layer extends in a depth direction of the second trench and is in contact with the second semiconductor layer and the second insulating film, a step of forming a diode impurity region of the first conductivity type on the first surface of the semiconductor layer such that the diode impurity region is in contact with the first sinker layer, a step of forming a first wiring so as to be electrically connected to the diode impurity region, and a step of forming a second wiring so as to be electrically connected to the second sinker layer.

In the method for manufacturing the semiconductor device according to a preferred embodiment of the present invention, the step of implanting the impurity of the second conductivity type may include a step of implanting an impurity at a tilt angle of 3° to 7° with respect to a normal direction of the first surface of the semiconductor layer.

Detailed Description of Preferred Embodiments of Present Invention

Next, preferred embodiments of the present invention will be described in detail with reference to the accompanying drawings.

FIG. 1 is a schematic perspective view of a semiconductor device 1 according to a preferred embodiment of the present invention.

The semiconductor device 1 is, for example, an LSI in the form of a chip. The semiconductor device 1 has a diode region 2 in which a Zener diode 28 (to be described later) is formed as one of the constituent elements of the LSI circuit. Although omitted in FIG. 1, the semiconductor device 1 may have a region, other than the diode region 2, in which other functional elements (for example, an LDMOS) are formed.

Figure 2:
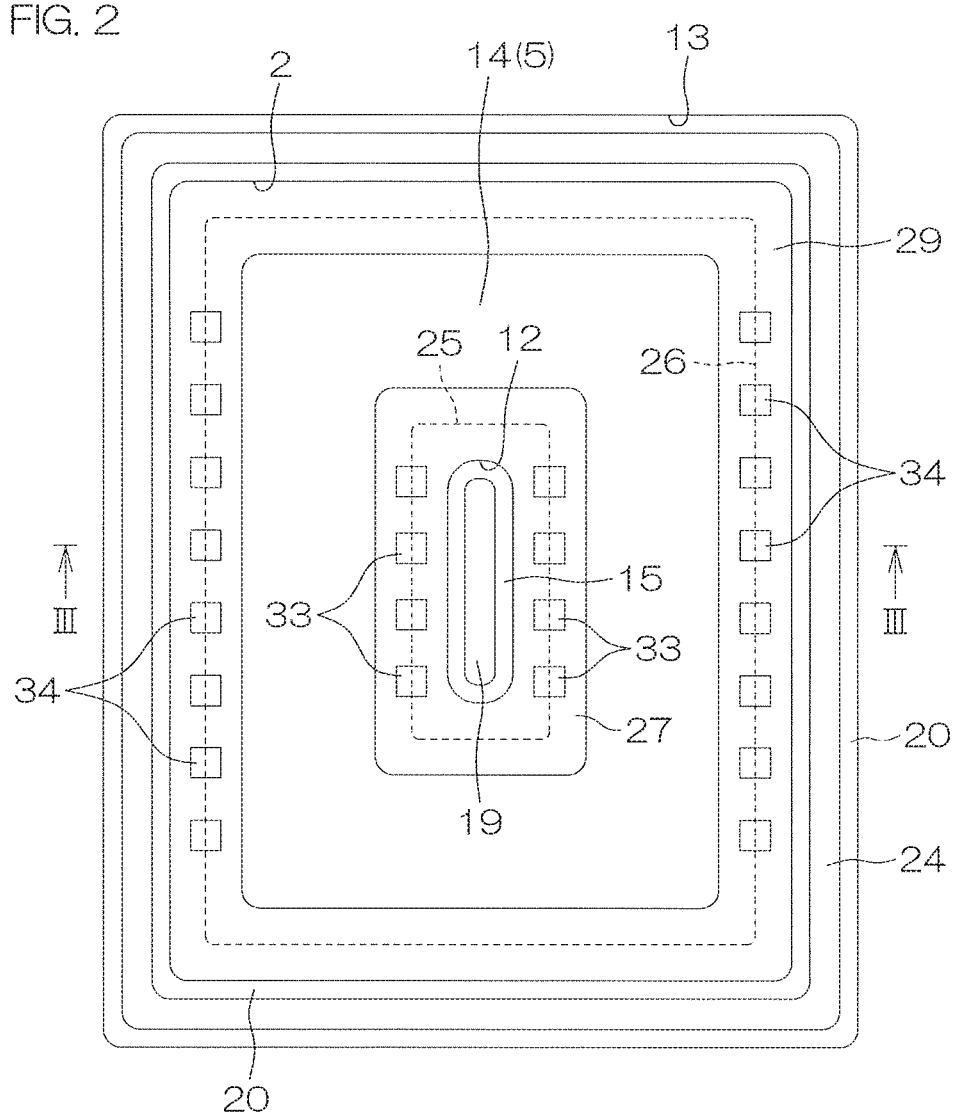
FIG. 2 is a schematic plan view of the semiconductor device, providing a transparent view of the portion surrounded by a two-dot chain line II in FIG. 1.
Figure 3:
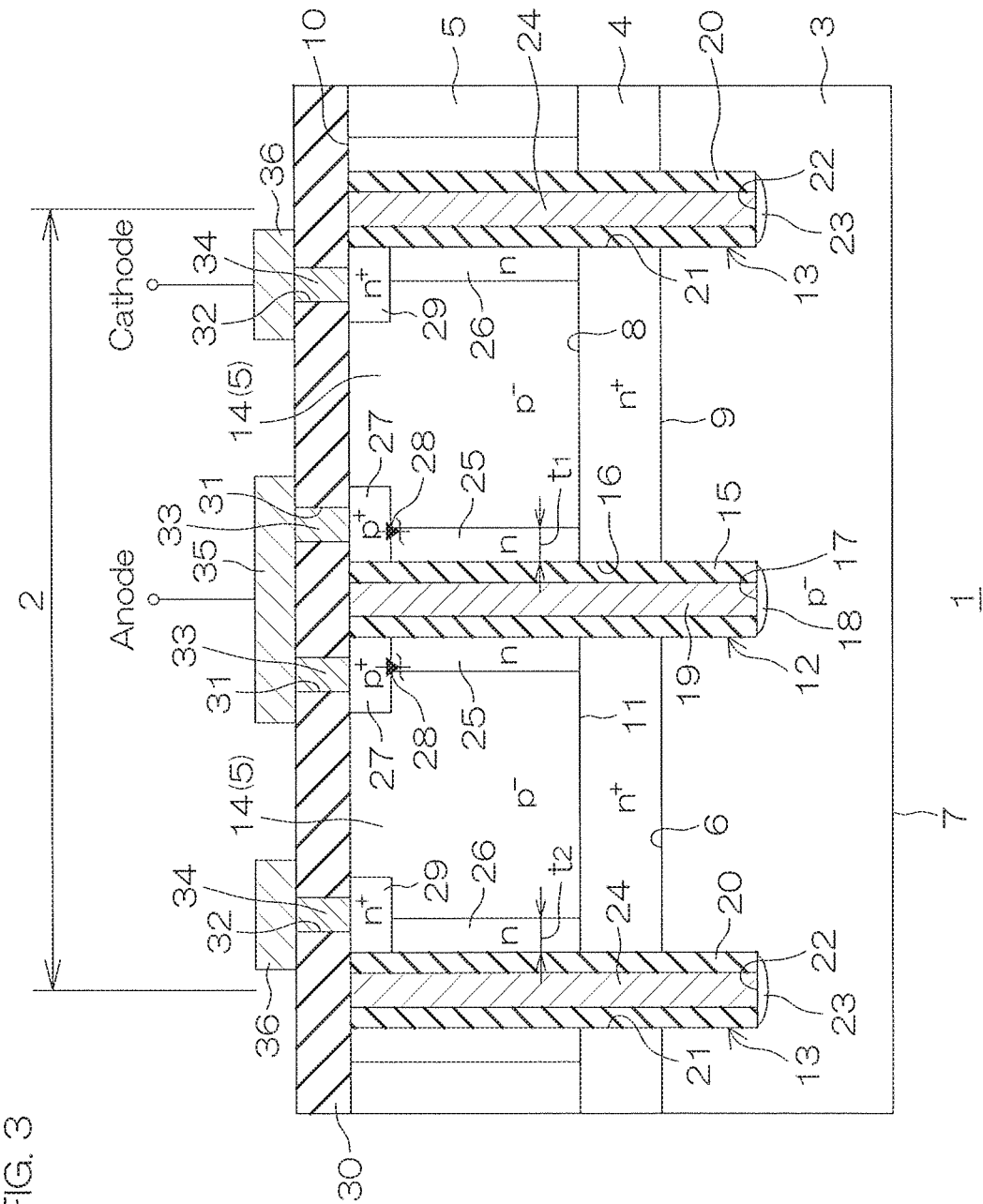
FIG. 3 is a sectional view showing a cross section taken along III-III in FIG. 2.

FIG. 2 is a schematic plan view of the semiconductor device 1, providing a transparent view of the portion surrounded by the two-dot chain line II in FIG. 1. FIG. 3 is a sectional view showing a cross section taken along III-III in FIG. 2.

The semiconductor device 1 includes a semiconductor substrate 3, an buried layer 4 as an example of the second semiconductor layer according to the present invention, and an epitaxial layer 5. The buried layer 4 is formed on the semiconductor substrate 3, and the epitaxial layer 5 is formed on the buried layer 4. The buried layer 4 is sandwiched between the semiconductor substrate 3 and the epitaxial layer 5.

The semiconductor substrate 3 has a principal surface 6 and a reverse surface 7 facing the opposite side of the principal surface 6 in the thickness direction of the semiconductor substrate 3. The principal surface 6 is a surface in contact with the buried layer 4. The reverse surface 7 is entirely exposed outside the semiconductor device 1.

The semiconductor substrate 3 is formed from a silicon (Si) substrate in this preferred embodiment. However, the semiconductor substrate may be formed from another material (for example, silicon carbide (SiC)). The semiconductor substrate 3 is of a p$^-$ type in this preferred embodiment. The semiconductor substrate 3 has an impurity concentration of, for example, $1\times10^{14}$ cm$^{-3}$ to $1\times10^{16}$ cm$^{-3}$. The semiconductor substrate 3 has a thickness of, for example, 500 μm to 800 μm before grinding.

The buried layer 4 has a first junction surface 8 and a second junction surface 9 facing the opposite side of the first junction surface 8 in the thickness direction of the buried layer 4. The first junction surface 8 is a surface in contact with the epitaxial layer 5. The second junction surface 9 is a surface in contact with the principal surface 6 of the semiconductor substrate 3.

The buried layer 4 is formed from silicon (Si) in this preferred embodiment. However, the buried layer may be formed from another material (for example, silicon carbide (SiC)). The buried layer 4 is of an n$^+$ type in this preferred embodiment. The buried layer 4 has an impurity concentration of, for example, $1\times10^{17}$ cm$^{-3}$ to $1\times10^{21}$ cm$^{-3}$. The buried layer 4 has a thickness of, for example, 2 μm to 10 μm.

The epitaxial layer 5 has an element principal surface 10 and a junction surface 11 facing the opposite side of the element principal surface 10 in the thickness direction of the epitaxial layer 5. The element principal surface 10 is a surface on which the Zener diode 28 (to be described later) and functional elements such as an LDMOS are formed. The junction surface 11 is a surface in contact with the first junction surface 8 of the buried layer 4.

The epitaxial layer 5 is formed from silicon (Si) in this preferred embodiment. However, the epitaxial layer may be formed from another material (for example, silicon carbide (SiC)). The epitaxial layer 5 has the same conductivity type as that of the semiconductor substrate 3 and is of a p$^-$ type in this preferred embodiment. The epitaxial layer 5 has an impurity concentration of, for example, $1\times10^{14}$ cm$^{-3}$ to $5\times10^{17}$ cm$^{-3}$. The epitaxial layer 5 has a thickness of, for example, 3 μm to 20 μm.

Referring to FIG. 2, the diode region 2 is isolated from other element regions by means of the element isolation structure formed in the semiconductor substrate 3, the buried layer 4, and the epitaxial layer 5. More specifically, a second trench 13 as an example of the element isolation structure is formed in the semiconductor substrate 3, the buried layer 4, and the epitaxial layer 5. As shown in FIG. 2, the second trench 13 is formed in an annular shape in a plan view along the element principal surface 10 of the epitaxial layer 5. This sets the region surrounded by the second trench 13 as the diode region 2. In this preferred embodiment, the second trench 13 is formed in a rectangular annular shape. However, the second trench may be formed in an annular shape.

A first trench 12 is formed in the diode region 2. As shown in FIG. 2, the first trench 12 is formed in a linear shape in a plan view. The first trench 12 is surrounded by the second trench 13 and is isolated from the second trench 13.

As shown in FIG. 3, the first trench 12 and the second trench 13 extend from the element principal surface 10 in the thickness direction of the epitaxial layer 5 in a sectional view in a direction intersecting the element principal surface 10 of the epitaxial layer 5. The first trench 12 and the second trench 13 penetrate the buried layer 4 and have bottom portions midway along the thickness direction of the semiconductor substrate 3. This forms a floating region 14, in the diode region 2, as an example of the first portion according to the present invention from part of the epitaxial layer 5 defined by the buried layer 4, the first trench 12, and the second trench 13. The first trench 12 and the second trench 13 have a depth of, for example, 5 μm to 30 μm.

A first insulating film 15 is formed on the inner surface of the first trench 12. In this preferred embodiment, the first insulating film 15 is formed on a side surface 16 of the first trench 12, and the side surface 16 of the first trench 12 is covered by the first insulating film 15. On the other hand, a bottom surface 17 (part of the semiconductor substrate 3) of the first trench 12 is not covered by the first insulating film 15. A first impurity region 18 is formed on the bottom surface 17 of the first trench 12. The first impurity region 18 has the same conductivity type as that of the semiconductor substrate 3 and is of a $p^+$ type in this preferred embodiment. The impurity concentration of the first impurity region 18 is higher than that of the semiconductor substrate 3 and is, for example, $1 \times 10^{18}$ $cm^{-3}$ to $5 \times 10^{20}$ $cm^{-3}$.

A first conductor 19 is embedded in the first trench 12 through the first insulating film 15. The first conductor 19 is embedded from the bottom surface 17 of the first trench 12 to the opening end and is in contact with the first impurity region 18 at the bottom surface 17. In this preferred embodiment, the first conductor 19 is formed from impurity-doped polysilicon (for example, $p^+$ type polysilicon).

A second insulating film 20 is formed on the inner surface of the second trench 13. In this preferred embodiment, the second insulating film 20 is formed on a side surface 21 of the second trench 13, and the side surface 21 of the second trench 13 is covered by the second insulating film 20. On the other hand, a bottom surface 22 (part of the semiconductor substrate 3) of the second trench 13 is not covered by the second insulating film 20. A second impurity region 23 is formed on the bottom surface 22 of the second trench 13. The second impurity region 23 has the same conductivity type as that of the semiconductor substrate 3 and is of a $p^+$ type in this preferred embodiment. The impurity concentration of the second impurity region 23 is higher than that of the semiconductor substrate 3 and is, for example, $1 \times 10^{18}$ $cm^{-3}$ to $5 \times 10^{20}$ $cm^{-3}$.

A second conductor 24 is embedded in the second trench 13 through the second insulating film 20. The second conductor 24 is embedded from the bottom surface 22 of the second trench 13 to the opening end and is in contact with the second impurity region 23 at the bottom surface 22. In this preferred embodiment, the second conductor 24 is formed from impurity-doped polysilicon (for example, $p^+$ type polysilicon).

Referring to FIG. 3, a first sinker layer 25 and a second sinker layer 26 are formed in the floating region 14.

The first sinker layer 25 extends in the depth direction of the first trench 12 and is in contact with the buried layer 4 and the first insulating film 15. More specifically, the first sinker layer 25 is formed in an annular shape surrounding the first trench 12 as shown in FIG. 2, and is in contact with the entire first insulating film 15 in the depth direction of the first trench 12 as shown in FIG. 3. The first sinker layer 25 has a thickness $t_1$ of 0.5 μm to 5 μm in a direction orthogonal to the depth direction of the first trench 12.

A diode impurity region 27 is formed at an end portion of the first sinker layer 25 which is located alongside the element principal surface 10. The diode impurity region 27 is exposed from the element principal surface 10 of the epitaxial layer 5. As shown in FIG. 2, the diode impurity region 27 is formed in an annular shape surrounding the first trench 12 and is in contact with the first insulating film 15.

The first sinker layer 25 has the same conductivity type as that of the buried layer 4 and is of an n type in this preferred embodiment. On the other hand, the diode impurity region 27 has the same conductivity type as that of the epitaxial layer 5 and is of a $p^+$ type in the preferred embodiment. This forms a pn junction between the first sinker layer 25 and the diode impurity region 27. The pn junction forms the Zener diode 28 in the diode region 2.

The impurity concentration of the first sinker layer 25 is a factor for determining the breakdown voltage of the Zener diode 28 and hence is set to a desired concentration. In this preferred embodiment, the impurity concentration of the first sinker layer 25 is, for example, $1 \times 10^{17}$ $cm^{-3}$ to $5 \times 10^{20}$ $cm^{-3}$. On the other hand, the impurity concentration of the diode impurity region 27 is higher than that of the epitaxial layer 5 and is, for example, $1 \times 10^{19}$ $cm^{-3}$ to $5 \times 10^{20}$ $cm^{-3}$.

The second sinker layer 26 extends in the depth direction of the second trench 13 and is in contact with the buried layer 4 and the second insulating film 20. More specifically, the second sinker layer 26 is formed in an annular shape along the second trench 13 as shown in FIG. 2 and is in contact with the entire second insulating film 20 in the depth direction of the second trench 13 as shown in FIG. 3. With this structure, the first sinker layer 25 is surrounded by the second sinker layer 26. The second sinker layer 26 has a thickness $t_2$ of 0.5 μm to 5 μm in a direction orthogonal to the depth direction of the second trench 13.

A contact region 29 is formed at an end portion of the second sinker layer 26 which is located beside the element principal surface 10. The contact region 29 is exposed from the element principal surface 10 of the epitaxial layer 5. As shown in FIG. 2, the contact region 29 is formed in an annular shape along the second trench 13 and is in contact with the second insulating film 20.

The second sinker layer 26 has the same conductivity type as that of the buried layer 4 and is of an n type in this preferred embodiment. Likewise, the contact region 29 has the same conductivity type as that of the buried layer 4 and is of an $n^+$ type in the preferred embodiment. The impurity concentration of the second sinker layer 26 is, for example, $1 \times 10^{17}$ $cm^{-3}$ to $5 \times 10^{26}$ $cm^{-3}$. On the other hand, the impurity concentration of the contact region 29 is higher than that of the second sinker layer 26 and is, for example, $5 \times 10^{19}$ $cm^{-3}$ to $5 \times 10^{20}$ $cm^{-3}$.

An insulating film 30 is formed on the epitaxial layer 5. The insulating film 30 may be called an interlayer insulting film or a field insulting film. The insulating film 30 has a plurality of first contact openings 31 for selectively exposing the diode impurity region 27 and a plurality of second contact openings 32 for selectively exposing the contact region 29. The insulating film 30 may be formed from, for example, silicon oxide ($SiO_2$) or silicon nitride (SiN).

First contact plugs 33 and second contact plugs 34, which are conductive, are respectively embedded in the first contact openings 31 and the second contact openings 32. The first contact plugs 33 and the second contact plugs 34 may be formed from, for example, tungsten (W).

An anode wiring 35 as an example of the first wiring according to the present invention and a cathode wiring 36 as an example of the second wiring according to the present invention are formed on the insulating film 30. The anode wiring 35 is electrically connected to the diode impurity region 27 through the first contact plug 33. The cathode wiring 36 is electrically connected to the contact region 29 through the second contact plug 34. The anode wiring 35 and the cathode wiring 36 may be formed from, for example, aluminum (Al) or its alloy. Note that the anode wiring 35 and the cathode wiring 36 may be respectively called an anode electrode and a cathode electrode.

FIGS. 4A to 4F each are a view showing part of a manufacturing process for the semiconductor device 1.

Figure 4A:
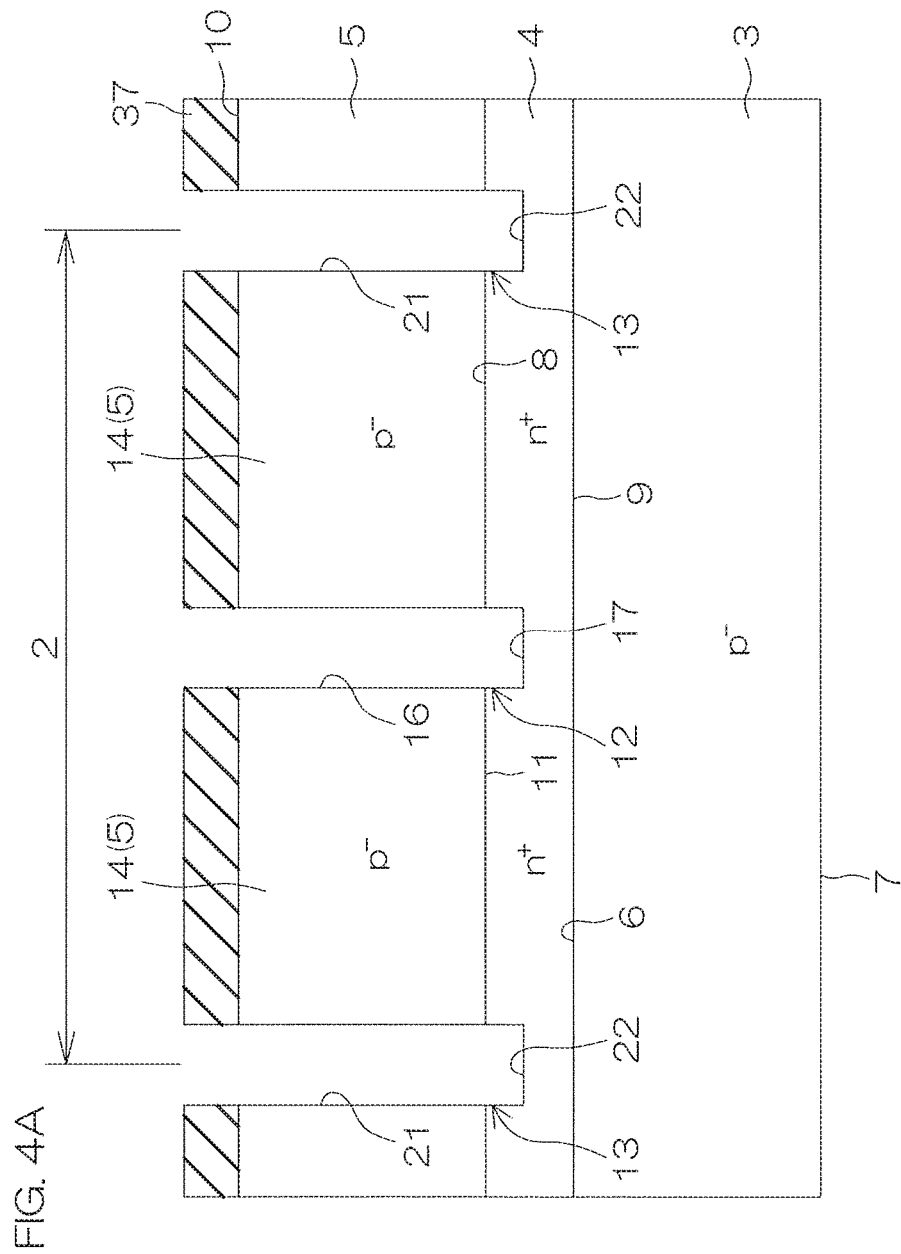
FIGS. 4A to 4F are views each showing part of a manufacturing process for the semiconductor device.

As shown in FIG. 4A, in order to manufacture the semiconductor device 1, a mask 37 is formed on the element principal surface 10 of the epitaxial layer 5 in which the buried layer 4 is formed. The mask 37 may be a hard mask formed from, for example, silicon oxide ($SiO_2$). Next, the first trench 12 and the second trench 13 are simultaneously formed by selectively etching the epitaxial layer 5 and the buried layer 4 through the mask 37. At this stage, the bottom portions of the first trench 12 and the second trench 13 are positioned midway along the thickness direction of the buried layer 4.

Figure 4B:
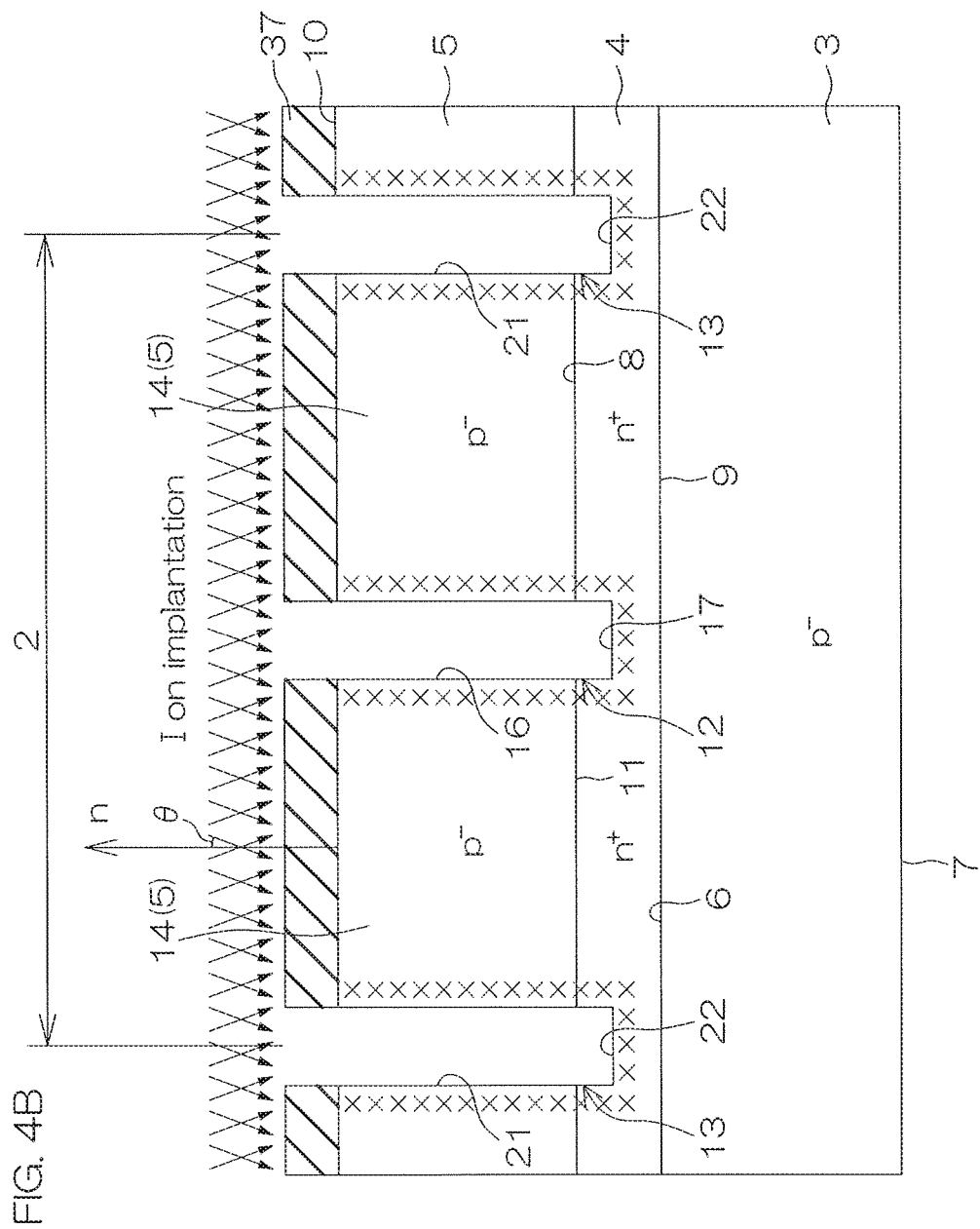

Next, as shown in FIG. 4B, while the mask 37 is left on the epitaxial layer 5, an n type impurity is implanted into the side surfaces 16 and 21 of the first trench 12 and the second trench 13. Referring to FIG. 4B, "Xs" represent n type impurity implantation locations. In this preferred embodiment, the n type impurity is implanted at a tilt angle $\theta$ of 3° to 7° with respect to a normal n direction of the element principal surface 10 of the epitaxial layer 5. This makes it possible to efficiently implant the n type impurity into the side surfaces 16 and 21 of the first trench 12 and the second trench 13. In forming the Zener diode 28 having, for example, a breakdown voltage of 5 V to 9 V, the n type impurity may be rotationally implanted at a dose of $1\times10^{14}$ to $5\times10^{15}$ $cm^{-2}$ at the tilt angle $\theta$ of about 5°. As the n type impurity, phosphorus (P) or the like can be used.

Figure 4C:
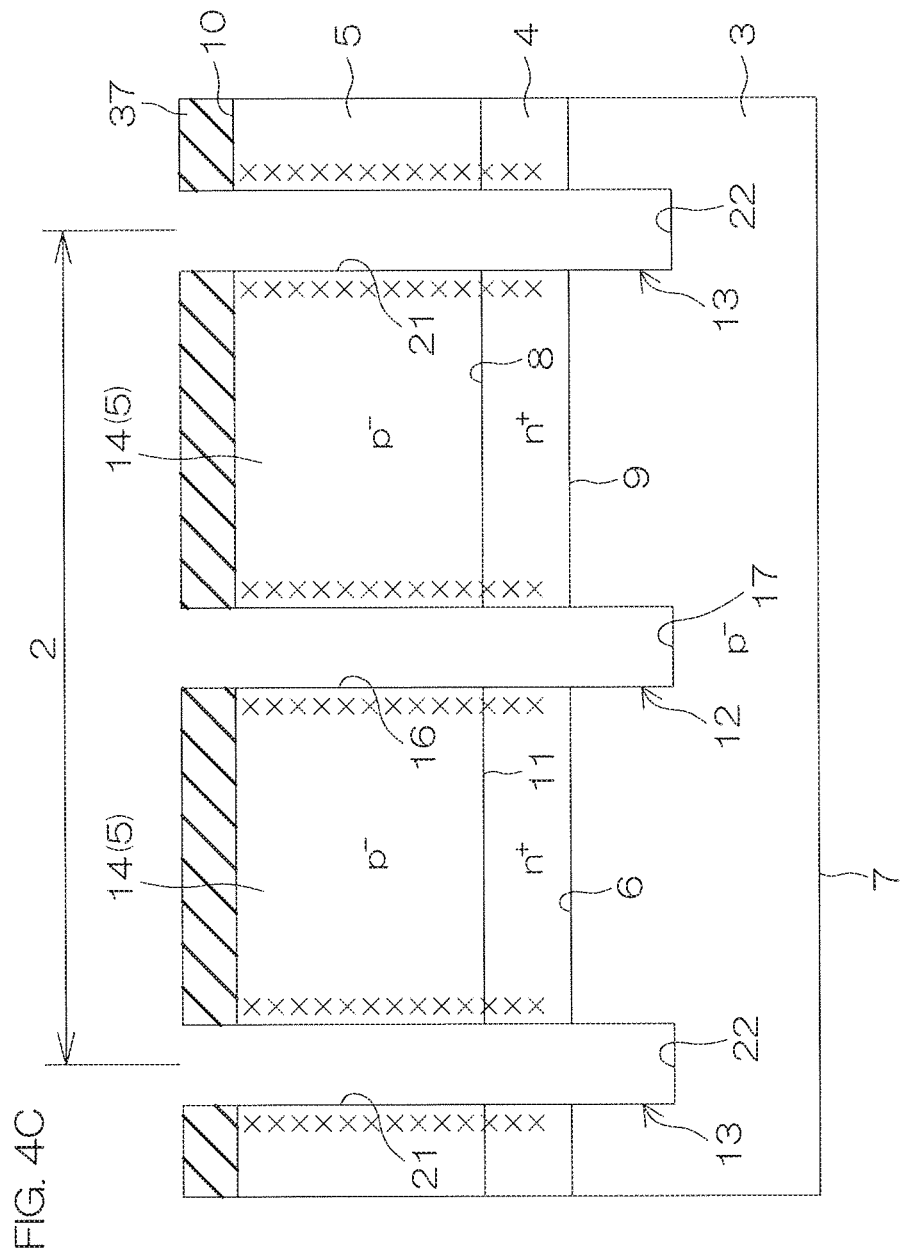

Next, as shown in FIG. 4C, while the mask 37 is left on the epitaxial layer 5, the first trench 12 and the second trench 13 are additionally etched. This further etches the first trench 12 and the second trench 13 to make the bottom portions of the first trench 12 and the second trench 13 reach the semiconductor substrate 3. Thereafter, the mask 37 is removed.

Figure 4D:
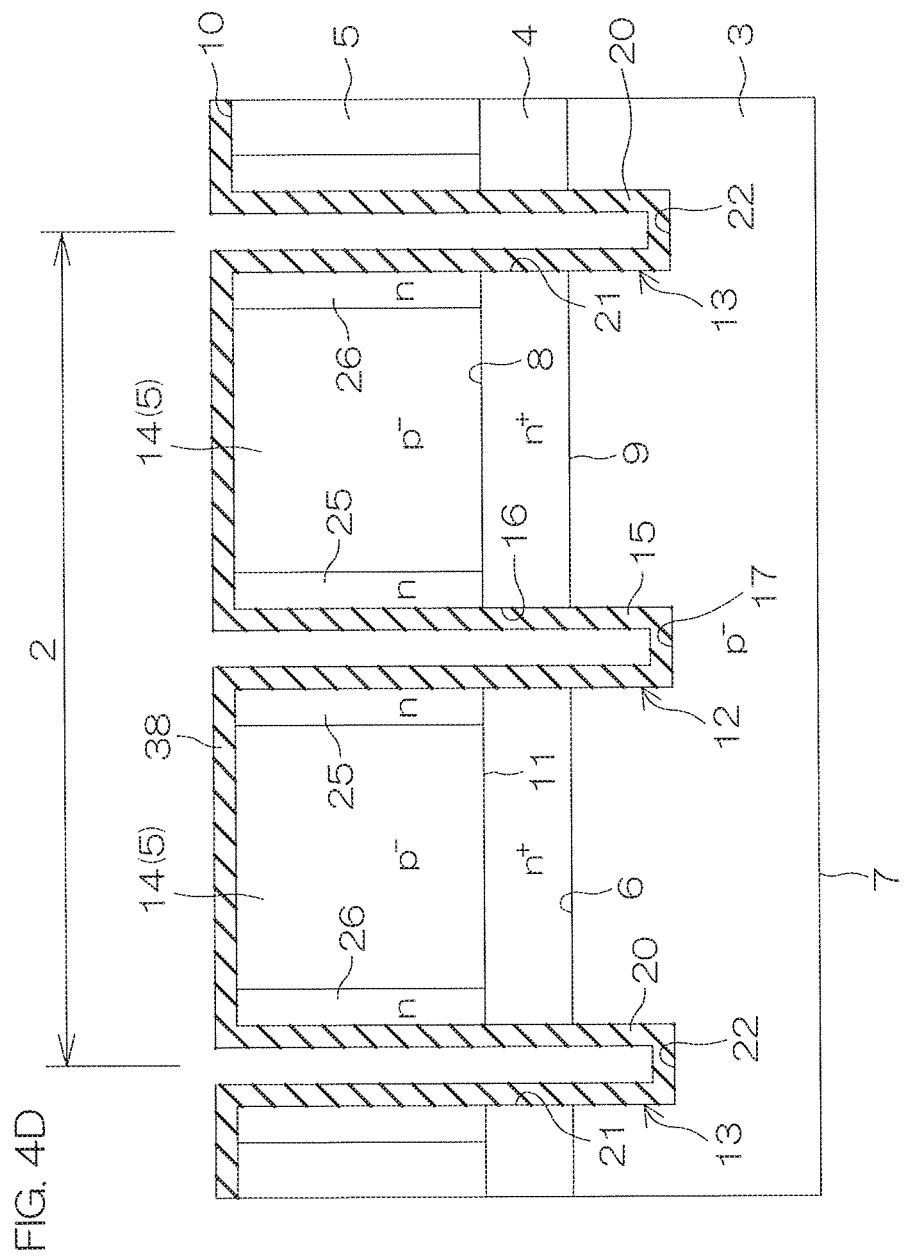

Next, as shown in FIG. 4D, an insulating film 38 is formed on the inner surface (the side surface 16 and the bottom surface 17) of the first trench 12, the inner surface (the side surface 21 and the bottom surface 22) of the second trench 13, and the element principal surface 10 of the epitaxial layer 5. The insulating film 38 includes the first insulating film 15 formed on the inner surface of the first trench 12 and the second insulating film 20 formed on the inner surface of the second trench 13. The insulating film 38 is formed by, for example, a thermal oxidation process. With this process, the n type impurity in the side surfaces 16 and 21 of the first trench 12 and the second trench 13 is diffused owing to the heat generated at the time of forming the insulating film 38, thereby forming the first sinker layer 25 and the second sinker layer 26.

Note that the insulating film 38 may be formed by a CVD method. In this case, a heat treatment process for diffusing the n type impurity may be additionally performed as a process other than the process for forming the insulating film 38.

Figure 4E:
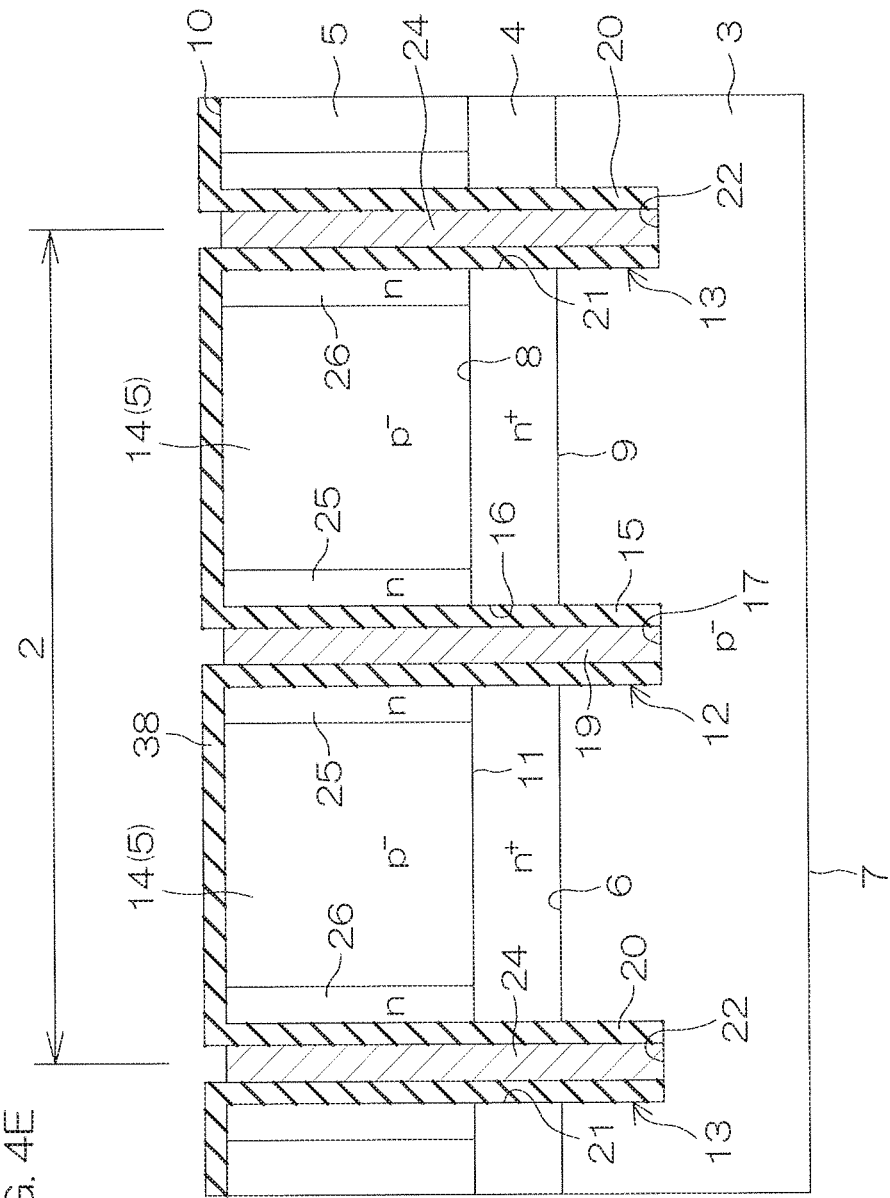

Next, as shown in FIG. 4E, a portion of the first insulating film 15 which is located on the bottom surface 17 of the first trench 12 and a portion of the second insulating film 20 which is located on the bottom surface 22 of the second trench 13 are removed by etching. Next, the first conductor 19 and the second conductor 24 are respectively embedded in the first trench 12 and the second trench 13. Thereafter, a portion of the insulating film 38 which is located on the element principal surface 10 of the epitaxial layer 5 is removed. As a result, the element principal surface 10 of the epitaxial layer 5 is exposed.

Figure 4F:
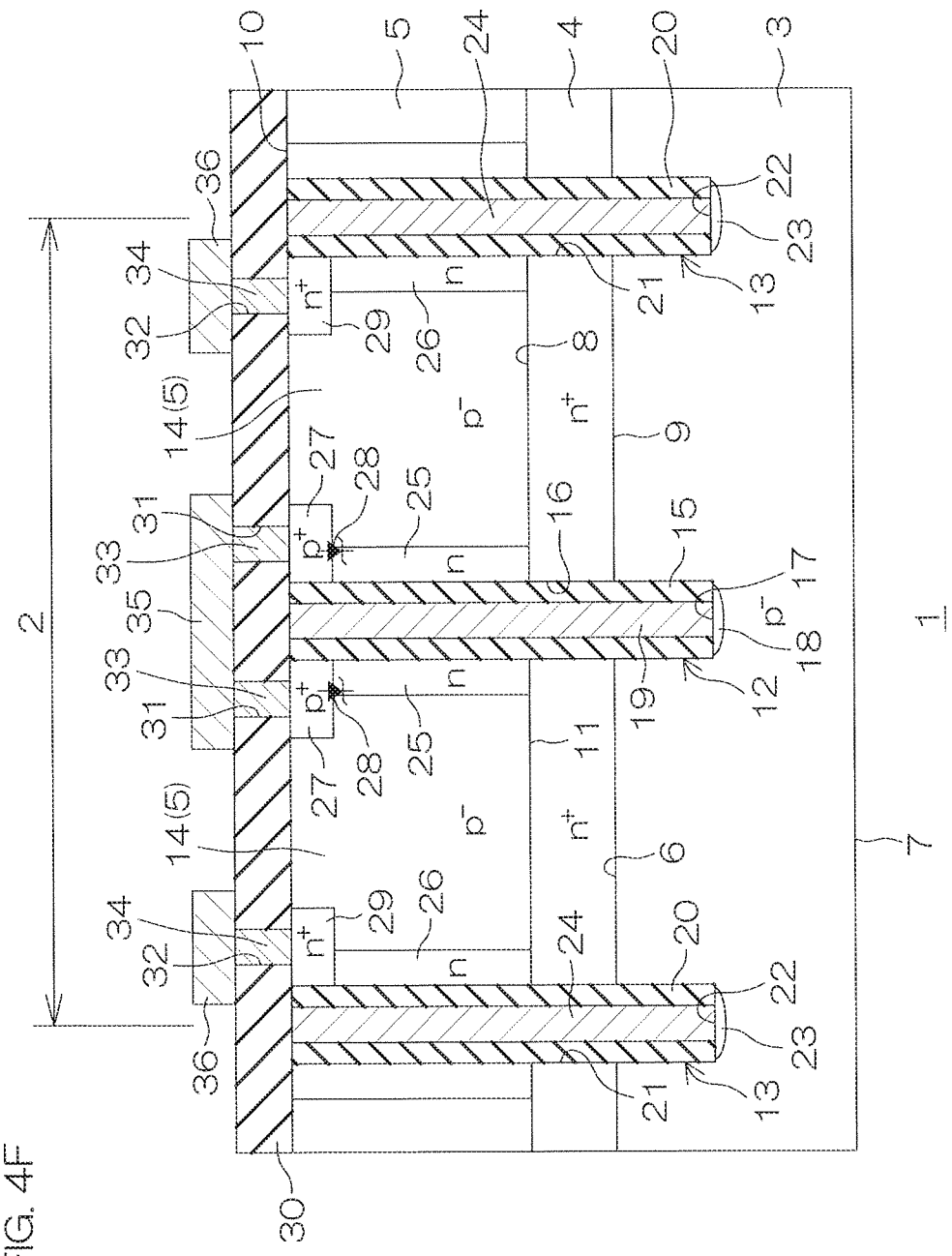

Next, as shown in FIG. 4F, an n type impurity and a p type impurity are selectively implanted into the element principal surface 10 of the epitaxial layer 5. Next, the epitaxial layer 5 is heat-treated to diffuse the n type impurity and the p type impurity, thereby forming the $n^+$ type contact region 29 and the $p^+$ type diode impurity region 27. The p type impurity in the first conductor 19 and the second conductor 24 is diffused into the semiconductor substrate 3 to respectively form the first impurity region 18 and the second impurity region 23 on the bottom surfaces 17 and 22 of the first trench 12 and the second trench 13.

Next, the insulating film 30 is formed on the epitaxial layer 5. The first contact openings 31 and the second contact openings 32 are formed in the insulating film 30. Next, the first contact plugs 33 and the second contact plugs 34 are respectively embedded in the first contact openings 31 and the second contact openings 32. Subsequently, the structure of the diode region 2 described above is obtained by forming the anode wiring 35 and the cathode wiring 36 on the insulating film 30.

According to the semiconductor device 1, the structure of the Zener diode 28 is formed by a pn junction between the diode impurity region 27 and the first sinker layer 25 formed inside the epitaxial layer 5. The Zener diode 28 having the above structure has the breakdown voltage (Zener voltage) determined by the concentration relationship between the diode impurity region 27 and the first sinker layer 25.

Figure 5:
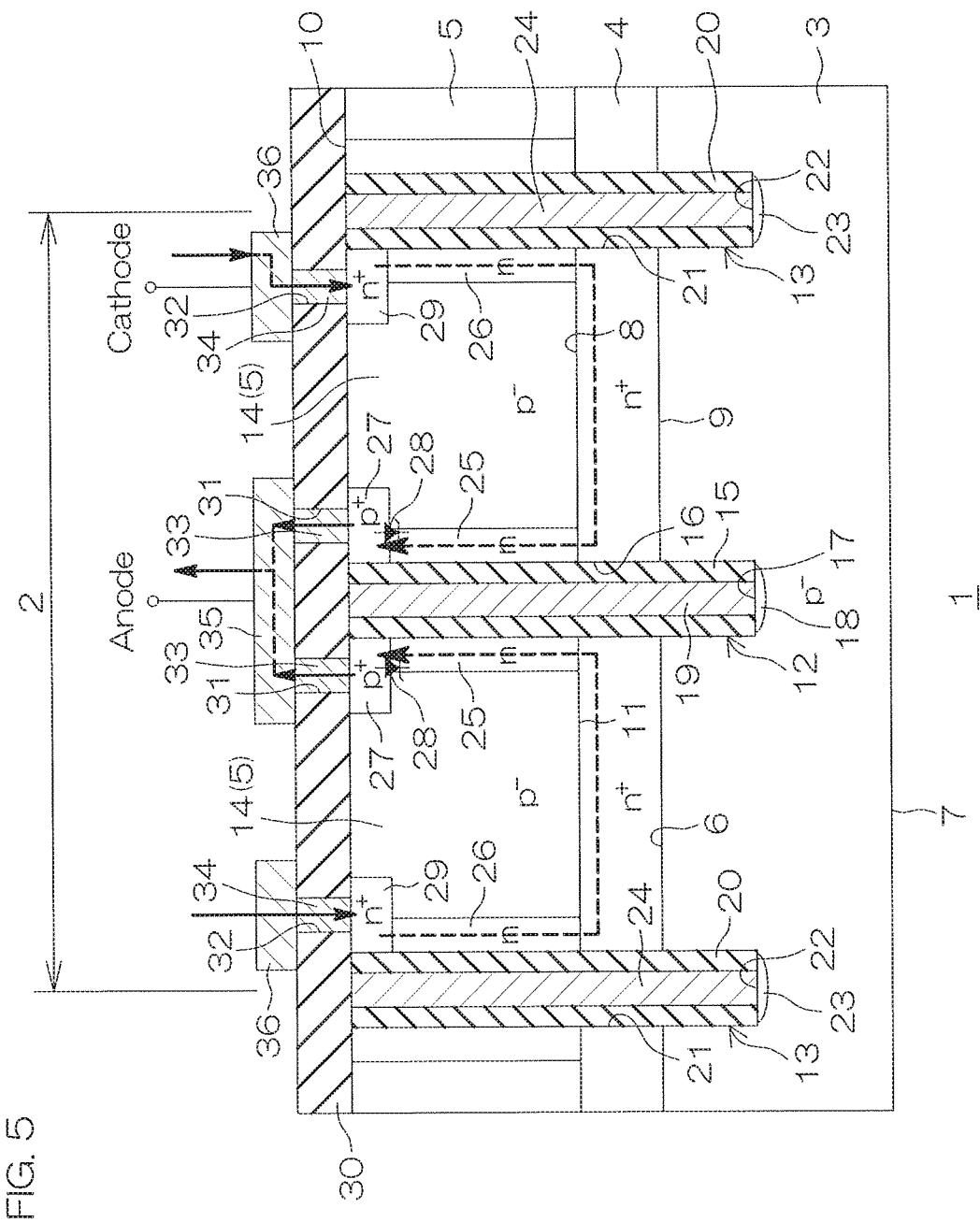
FIG. 5 is a view for explaining the operation of the semiconductor device.

Referring to FIG. 5, when a voltage is applied between the anode wiring 35 and the cathode wiring 36, with the anode wiring 35 being on the low potential side and the cathode wiring 36 being on the high potential side, a reverse voltage is applied to the Zener diode 28. When this reverse voltage exceeds the breakdown voltage, a breakdown phenomenon occurs at the interface (the inside of the epitaxial layer 5) between the diode impurity region 27 and the first sinker layer 25, and a current flows. Thereafter, the current flows from the second sinker layer 26 into the anode wiring 35 through the buried layer 4 and the first sinker layer 25 as indicated by the arrow. The occurrence of the breakdown phenomenon of the Zener diode 28 inside the epitaxial layer 5 in this manner can suppress a change in breakdown voltage over time.

The first sinker layer 25 and the second sinker layer 26 constituting the Zener diode 28 are formed by an n type impurity implantation using the mask 37 used at the time of forming the first trench 12 and the second trench 13 (FIG. 4B). Accordingly, there is no need to add a dedicated mask layer for forming the first sinker layer 25 and the second sinker layer 26. This makes it possible to suppress an increase in cost.

A factor that determines the depth of the first sinker layer 25 and the second sinker layer 26 extending from the element principal surface 10 of the epitaxial layer 5 to the bottom portions of the first trench 12 and the second trench 13 is an n type impurity implantation range for the side surfaces 16 and 21 of the first trench 12 and the second trench 13. Accordingly, in order to bring the first sinker layer 25 and the second sinker layer 26 into contact with the buried layer 4, it is only required to extend the n type impurity implantation range to the bottom portions of the first trench 12 and the second trench 13. This simplifies the process and makes it possible to suppress an increase in cost.

In contrast to this, in the manner of selectively implanting an impurity into a surface portion of the epitaxial layer 5 and bringing the impurity into contact with the buried layer 4 by heat diffusion, it is necessary to perform heat diffusion at high temperature for a long period of time. Accordingly, the heat treatment expands the buried layer 4. As a result, the first trench 12 and the second trench 13 need to be formed deeper. This may lead to an increase in cost.

Although a preferred embodiment of the present invention has been described above, the present invention can be carried out in other preferred embodiments.

Figure 6:
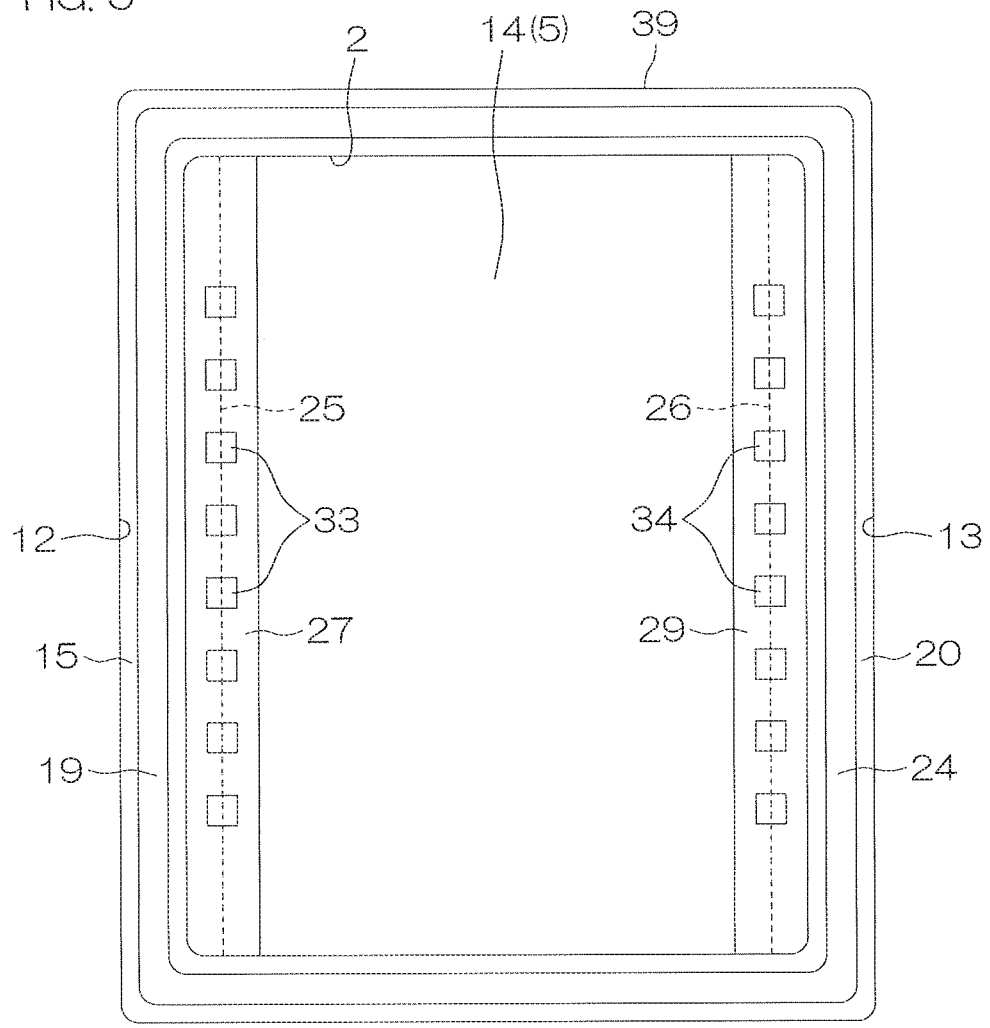
FIG. 6 is a view for explaining a modification of the semiconductor device.

For example, in the preferred embodiment, the first trench 12 and the second trench 13 are formed separately from each other, and the first sinker layer 25 and the second sinker layer 26 are formed in an annular shape along the first trench 12 and the second trench 13. In contrast to this, as shown in FIG. 6, although the first trench 12 and the second trench 13 are separated from each other in a sectional view, they may be formed continuously in a plan view.

More specifically, a trench 39 having a rectangular annular shape in a plan view is formed in the epitaxial layer 5, the buried layer 4, and the semiconductor substrate 3. A pair of opposing portions of the trench 39 may be called the first trench 12 and the second trench 13. In this case, the first sinker layer 25 may be formed in a linear shape extending along the first trench 12 in a plan view, and the second sinker layer 26 may be formed in a linear shape extending along the second trench 13 in a plan view. Accordingly, the first sinker layer 25 and the second sinker layer 26 may have linear shapes parallel to each other in a plan view.

Figure 7:
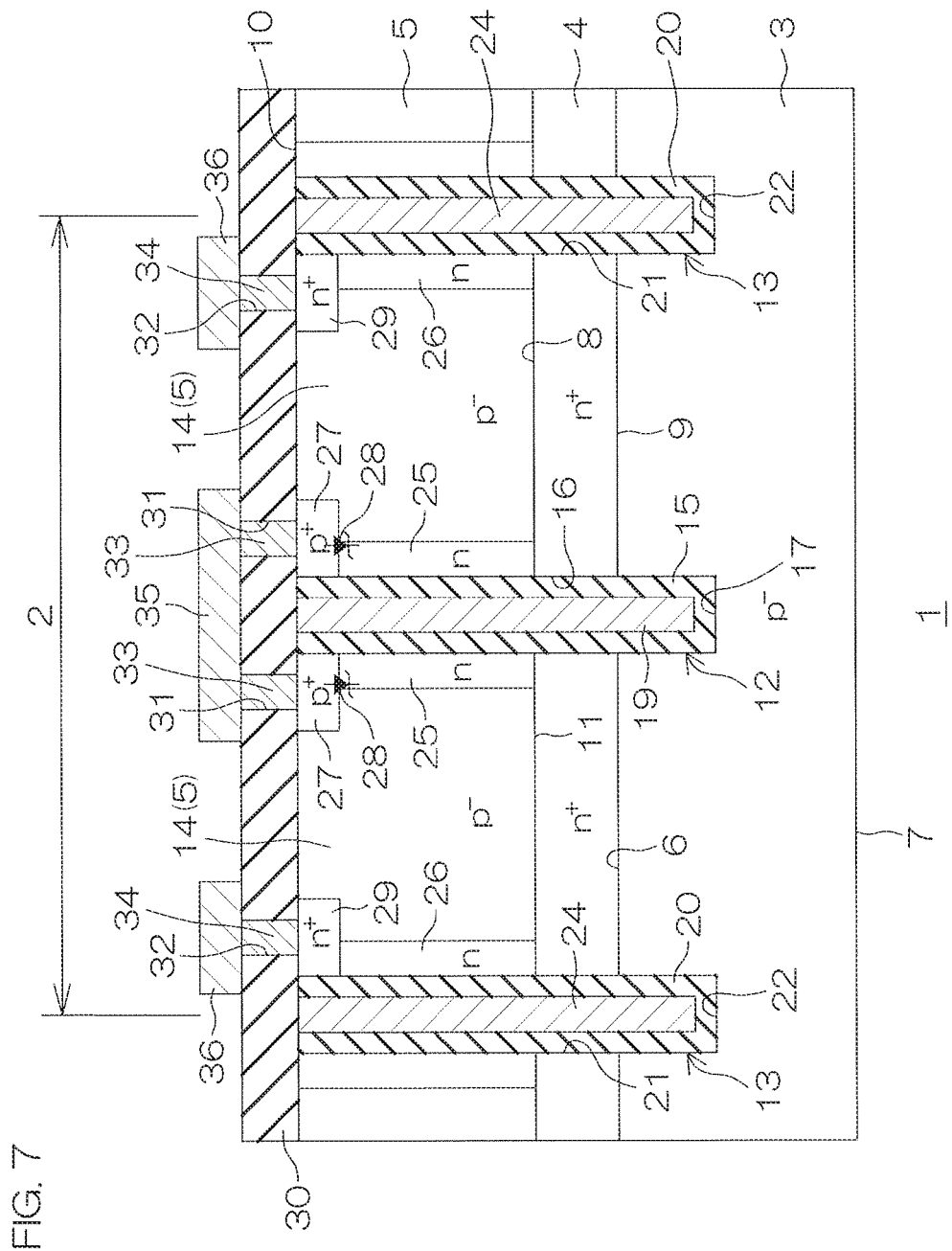
FIG. 7 is a view for explaining a modification of the semiconductor device.

As shown in FIG. 7, the first insulating film 15 may be formed integrally with the side surface 16 and the bottom surface 17 of the first trench 12, and the second insulating film 20 may be formed integrally with the side surface 21 and the bottom surface 22 of the second trench 13. In this case, the first impurity region 18 and the second impurity region 23 may not be formed.

Figure 8:
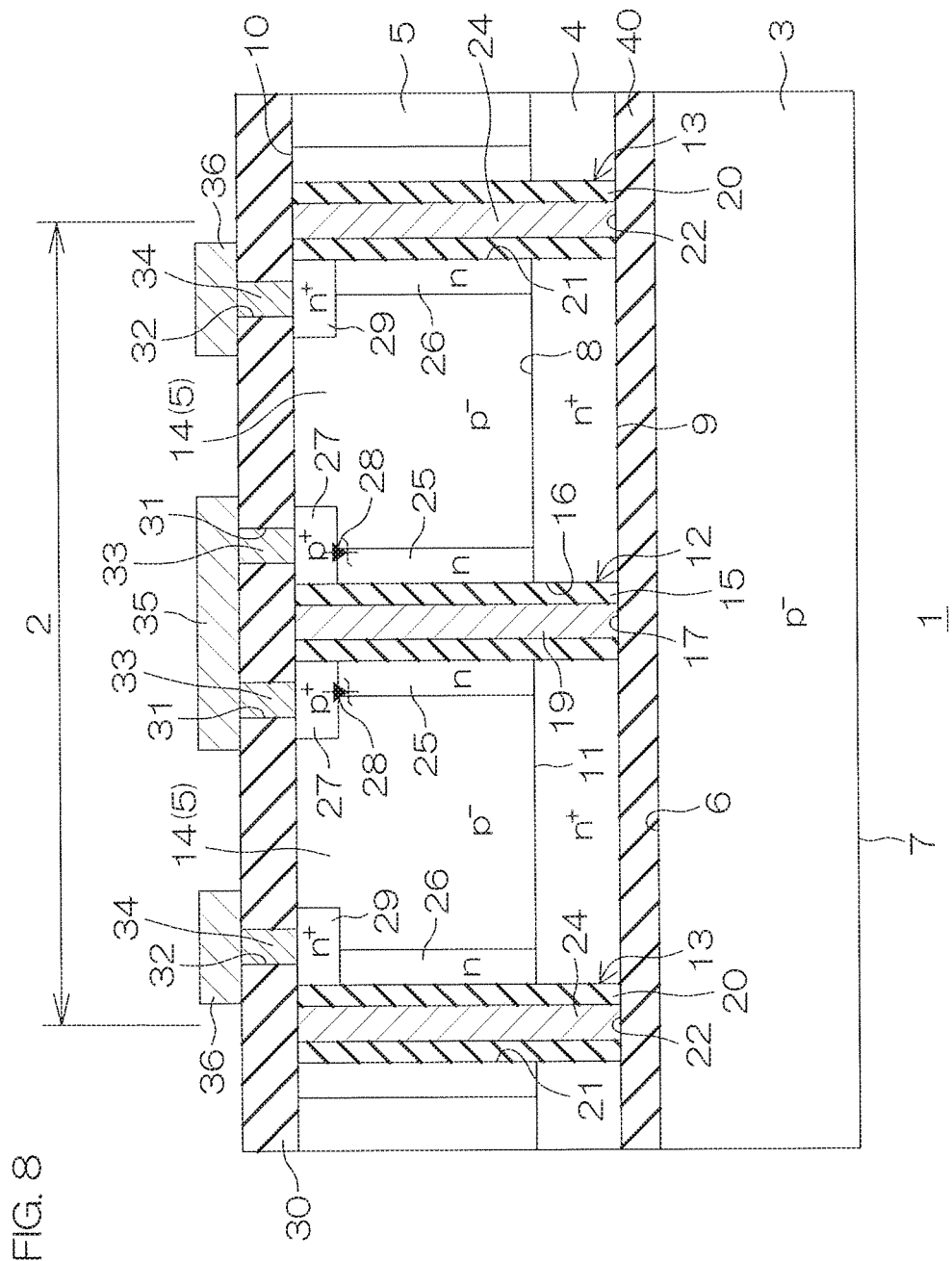
FIG. 8 is a view for explaining a modification of the semiconductor device.

In addition, as shown in FIG. 8, forming an insulating film 40 on the semiconductor substrate 3 allows the buried layer 4 and the epitaxial layer 5 to have an SOI (Silicon On Insulator) structure.

Furthermore, in the above preferred embodiment, the cathode (second sinker layer 26) is formed so as to surround the anode (first sinker layer 25). However, the positions of the anode and the cathode may be interchanged.

Besides the above, various design changes may be made within the scope of the matters described in the claims.

What is claimed is:

1. A semiconductor device comprising:
   a semiconductor layer of a first conductivity type having a first surface and a second surface on an opposite side to the first surface;
   a second semiconductor layer of a second conductivity type embedded in the semiconductor layer;
   a first trench and a second trench formed in the semiconductor layer such that the first trench and the second trench extend from the first surface in a thickness direction of the semiconductor layer and penetrate the second semiconductor layer in a sectional view in a direction intersecting the first surface;
   a first insulating film formed on at least a side surface of the first trench;
   a second insulating film formed on at least a side surface of the second trench;
   a first sinker layer of the second conductivity type formed in a first portion of the semiconductor layer defined by the second semiconductor layer, the first trench and second trench such that the first sinker layer extends in a depth direction of the first trench and is in contact with the second semiconductor layer and the first insulating film;
   a second sinker layer of the second conductivity type formed in the first portion of the semiconductor layer such that the second sinker layer extends in a depth direction of the second trench and is in contact with the second semiconductor layer and the second insulating film;
   a diode impurity region of the first conductivity type which is formed on the first surface of the semiconductor layer and forms a Zener diode by pn junction between the first sinker layer and the diode impurity region;
   a first wiring electrically connected to the diode impurity region; and
   a second wiring electrically connected to the second sinker layer.

2. The semiconductor device according to claim 1, wherein the first sinker layer is in contact with the first insulating film over the entire depth direction of the first trench.

3. The semiconductor device according to claim 1, wherein the second sinker layer is in contact with the second insulating film over the entire depth direction of the second trench.

4. The semiconductor device according to claim 1, wherein the first sinker layer has a thickness of 0.5 µm to 5 µm in a direction orthogonal to the depth direction of the first trench.

5. The semiconductor device according to claim 1, wherein the second sinker layer has a thickness of 0.5 µm to 5 µm in a direction orthogonal to the depth direction of the second trench.

6. The semiconductor device according to claim 1, wherein the second semiconductor layer has a thickness of 2 µm to 10 µm.

7. The semiconductor device according to claim 1, further comprising:
   a first impurity region of the first conductivity type formed on a bottom surface of the first trench and having a higher impurity concentration than the semiconductor layer; and
   a first conductor that is embedded in the first trench through the first insulating film and is in contact with the first impurity region.

8. The semiconductor device according to claim 1, further comprising:
   a second impurity region of the first conductivity type formed on a bottom surface of the second trench and having a higher impurity concentration than the semiconductor layer; and
   a second conductor that is embedded in the second trench through the second insulating film and is in contact with the second impurity region.

9. The semiconductor device according to claim 1, wherein the first insulating film is formed on a side surface and a bottom surface of the first trench, and
   the semiconductor device includes a first conductor embedded in the first trench through the first insulating film.

10. The semiconductor device according to claim 1, wherein the second insulating film is formed on a side surface and a bottom surface of the second trench, and
    the semiconductor device includes a second conductor embedded in the second trench through the second insulating film.

11. The semiconductor device according to claim 1, wherein the second sinker layer is formed in an annular shape surrounding the first sinker layer in a plan view in a direction along the first surface.

12. The semiconductor device according to claim 1, wherein the first sinker layer and the second sinker layer are formed in linear shapes parallel to each other in a plan view in a direction along the first surface.

13. A method for manufacturing a semiconductor device, the method comprising:
    a step of forming a first trench and a second trench by selectively removing, through a mask, a semiconductor layer of a first conductivity type which has a first surface and a second surface on an opposite side to the first surface and in which a second semiconductor layer of a second conductivity type is embedded, with the first trench and the second trench extending from the first surface in a thickness direction of the semiconductor layer and penetrating the second semiconductor layer in a sectional view in a direction intersecting the first surface;
    a step of implanting an impurity of the second conductivity type into side surfaces of the first trench and the second trench while the mask is left on the semiconductor layer;
    a step of forming a first insulating film on at least a side surface of the first trench;
    a step of forming a second insulating film on at least a side surface of the second trench;
    a step of forming a first sinker layer of the second conductivity type and a second sinker layer of the second conductivity type by heat diffusion of an impurity of the second conductivity type such that the first sinker layer extends in a depth direction of the first trench and is in contact with the second semiconductor layer and the first insulating film, and the second sinker layer extends in a depth direction of the second trench and is in contact with the second semiconductor layer and the second insulating film;
    a step of forming a diode impurity region of the first conductivity type on the first surface of the semiconductor layer so as to be in contact with the first sinker layer;
    a step of forming a first wiring so as to be electrically connected to the diode impurity region; and
    a step of forming a second wiring so as to be electrically connected to the second sinker layer.

14. The method for manufacturing the semiconductor device according to claim 13, wherein the step of implanting the impurity of the second conductivity type includes a step of implanting an impurity at a tilt angle of 3° to 7° with respect to a normal direction of the first surface of the semiconductor layer.

* * * * *